(12) United States Patent
Seyyedy et al.

(10) Patent No.: US 7,732,221 B2
(45) Date of Patent: Jun. 8, 2010

(54) HYBRID MRAM ARRAY STRUCTURE AND OPERATION

(75) Inventors: Mirmajid Seyyedy, Boise, ID (US); Glen Hush, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 1109 days.

(21) Appl. No.: 10/847,338

(22) Filed: May 18, 2004

(65) Prior Publication Data
US 2004/0213044 A1 Oct. 28, 2004

Related U.S. Application Data

(63) Continuation of application No. 10/166,363, filed on Jun. 11, 2002, now Pat. No. 6,754,124.

(51) Int. Cl.
*G11C 11/15* (2006.01)
(52) U.S. Cl. .................. 438/3; 257/421; 257/E21.665; 257/E27.006; 365/158; 365/173; 438/129
(58) Field of Classification Search ...................... 438/3, 438/128, 129, 241; 365/158, 171, 173, 203; 257/421, E21.665, E27.006
See application file for complete search history.

(56) References Cited

U.S. PATENT DOCUMENTS

| | | | | |
|---|---|---|---|---|
| 5,166,758 A * | 11/1992 | Ovshinsky et al. | ............. | 257/3 |
| 5,761,115 A * | 6/1998 | Kozicki et al. | ............. | 365/182 |
| 5,835,396 A * | 11/1998 | Zhang | .......................... | 365/51 |
| 5,920,500 A * | 7/1999 | Tehrani et al. | .............. | 365/173 |
| 6,229,157 B1 * | 5/2001 | Sandhu | ......................... | 257/75 |
| 6,445,613 B1 * | 9/2002 | Nagai | .......................... | 365/171 |
| 6,566,698 B2 * | 5/2003 | Nishihara et al. | ........... | 257/295 |
| 6,574,135 B1 | 6/2003 | Komatsuzaki | | |
| 6,606,705 B1 | 8/2003 | Volk | | |
| 6,625,057 B2 * | 9/2003 | Iwata | ......................... | 365/158 |
| 6,643,159 B2 * | 11/2003 | Fricke et al. | .................. | 365/51 |
| 6,664,118 B2 * | 12/2003 | Nishihara et al. | .............. | 438/3 |
| 6,819,581 B2 * | 11/2004 | Ito | ............................. | 365/145 |
| 6,879,516 B2 * | 4/2005 | Nejad et al. | ................. | 365/171 |
| 6,882,553 B2 * | 4/2005 | Nejad et al. | .................... | 365/63 |
| 6,917,532 B2 * | 7/2005 | Van Brocklin et al. | ........ | 365/51 |
| 6,990,004 B2 * | 1/2006 | Iwata | .......................... | 365/63 |
| 7,023,743 B2 * | 4/2006 | Nejad et al. | ............ | 365/189.08 |
| 7,209,378 B2 * | 4/2007 | Nejad et al. | ................. | 365/148 |
| 7,291,878 B2 * | 11/2007 | Stipe | .......................... | 257/296 |
| 7,339,811 B2 * | 3/2008 | Nejad et al. | ................... | 365/63 |
| 7,440,339 B2 * | 10/2008 | Nejad et al. | ............ | 365/189.08 |
| 2002/0114206 A1 | 8/2002 | Honigschmid et al. | | |
| 2003/0103401 A1 | 6/2003 | Tran et al. | | |
| 2006/0171224 A1 * | 8/2006 | Nejad et al. | ................. | 365/205 |

* cited by examiner

*Primary Examiner*—Anh Phung
*Assistant Examiner*—Michael Lulis
(74) *Attorney, Agent, or Firm*—Dickstein Shapiro LLP

(57) ABSTRACT

This invention relates to MRAM technology and new variations on MRAM array architecture to incorporate certain advantages from both cross-point and 1T-1MTJ architectures. The fast read-time and higher signal-to-noise ratio of the 1T-1MTJ architecture and the higher packing density of the cross-point architecture are both exploited by combining certain characteristics of these layouts. A single access transistor 16 is used to read the multiple MRAM cells in a segment of a column, which can be stacked vertically above one another in a plurality of MRAM array layers arranged in a "Z" axis direction.

16 Claims, 4 Drawing Sheets

HYBRID MRAM ARRAY STRUCTURE AND OPERATION

This application is a continuation of application Ser. No. 10/166,363, filed Jun. 11, 2002 (now U.S. Pat. No. 6,754,124, issued on Jun. 22, 2004), the subject matter of which is incorporated by reference herein.

FIELD OF THE INVENTION

Background of the Invention

Integrated circuit designers have always sought the ideal semiconductor memory: a device that is randomly accessible, can be written or read very quickly, is non-volatile, but indefinitely alterable, and consumes little power. Magnetoresistive random access memory (MRAM) technology has been increasingly viewed as offering all these advantages.

A magnetic memory element has a structure which includes ferromagnetic layers separated by a non-magnetic barrier layer that forms a tunnel junction. Information can be stored as a digital "1" or a "0" as directions of magnetization vectors in these ferromagnetic layers. Magnetic vectors in one ferromagnetic layer are magnetically fixed or pinned, while the magnetic vectors of the other ferromagnetic layer are not fixed so that the magnetization direction is free to switch between "parallel" and "antiparallel" states relative to the pinned layer. In response to parallel and antiparallel states, the magnetic memory element represents two different resistance states, which are read by the memory circuit as either a "1" or a "0." It is the detection of these resistance states for the different magnetic orientations that allows the MRAM to read information.

There are different array architectures that are used within MRAM technology to read memory cells. For instance, one architecture used is the so-called one transistor—one magnetic tunnel junction per cell ("1T-1MTJ") architecture. This structure is based on a single access transistor for controlling read access to a single magnetic memory element. Another architecture is the cross-point architecture, where the read operation is performed without using an access transistor to control individual memory cells. This type of system uses row and column lines set to predetermined voltages levels to read a selected cell. Each system has its advantages and disadvantages. The cross-point system is somewhat slower in reading than the 1T-1MTJ system, as well as being "noisy" during a read operation; however, the cross-point array has the advantage in that it can be easily stacked for higher density. Additionally, a 1T-1MTJ array is faster, but necessarily less densely integrated than a cross-point array because additional space is needed to supply the 1-to-1 access transistor to memory cell ratio.

It would be desirable to have an MRAM read architecture that could utilize advantages from both the 1T-1MTJ and cross-point architectures while minimizing the disadvantages of each.

SUMMARY OF THE INVENTION

This invention provides an MRAM array read architecture which incorporates certain advantages from both cross-point and 1T-1MTJ architectures. The fast read-time and high signal-to-noise ratio of the 1T-1MTJ architecture and the higher packing density of the cross-point architecture are both exploited in the invention by uniquely combining certain characteristics of each. A single access transistor can be used to operate the reading of multiple vertically stacked column segments of MRAM cells. In this architecture, the plurality of column segments each comprise a plurality of standard MRAM cells which share a common sense line, though each MRAM cell can be read individually.

DETAILED DESCRIPTION

In the following detailed description, reference is made to various specific embodiments in which the invention may be practiced. These embodiments are described with sufficient detail to enable those skilled in the art to practice the invention, and it is to be understood that other embodiments may be employed, and that structural and electrical changes may be made without departing from the spirit or scope of the present invention.

The terms "substrate" and "wafer" can be used interchangeably in the following description and may include any semiconductor-based structure. The structure should be understood to include silicon, silicon-on insulator (SOI), silicon-on-sapphire (SOS), doped and undoped semiconductors, epitaxial layers of silicon supported by a base semiconductor foundation, and other semiconductor structures. The semiconductor need not be silicon-based. The semiconductor could be silicon-germanium, germanium, or gallium arsenide. When reference is made to the substrate in the following description, previous process steps may have been utilized to form regions or junctions in or over the base semiconductor or foundation.

Figure 1:
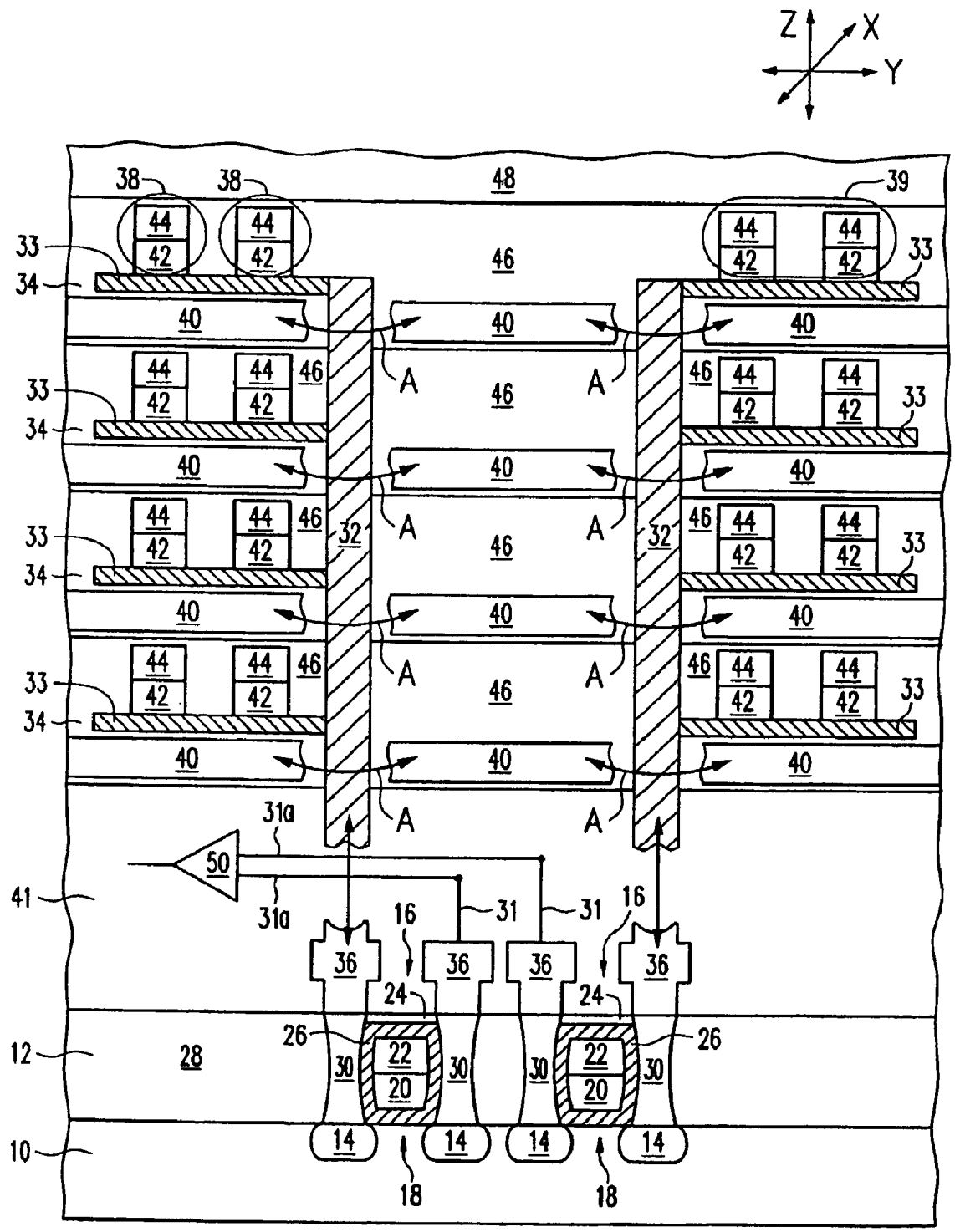
FIG. 1 is a two-dimensional cross-sectional view of a portion of an MRAM array, constructed in accordance with an exemplary embodiment of the invention.
Figure 2:
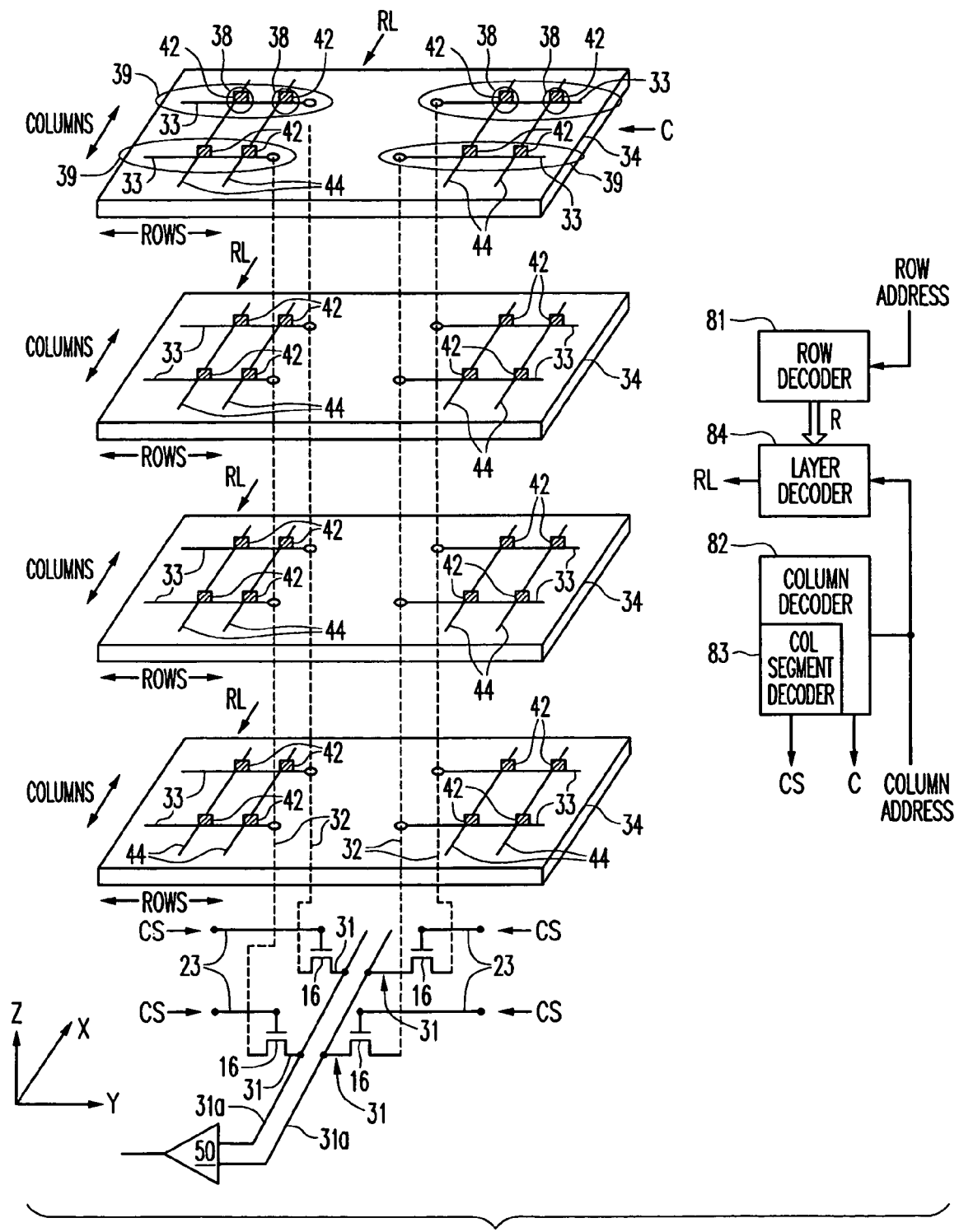
FIG. 2 is a three-dimensional perspective block diagram of the portion of the MRAM array illustrated in FIG. 1.

This invention relates to MRAM technology and new variations on MRAM array architecture to incorporate certain advantages from both cross-point and 1T-1MTJ architectures. The fast read-time and high signal-to-noise ratio of the 1T-1MTJ architecture and the higher packing density of the cross-point architecture are both exploited by combining certain characteristics of each layout. FIGS. 1-2 illustrate an exemplary embodiment of the invention. The memory cells are fabricated in array layers 34, where each array layer 34 includes a plurality of rows and a plurality of columns of cells. Each column is organized into a plurality of column segments 39. The array layers 34 are vertically stacked, one above another.

In the invention an access transistor 16 is used to control the reading of multiple MRAM cells 38, arranged in column segments 39, one from each array layer 34, which are stacked substantially above one another in the "Z" axis direction. In this architecture, each access transistor 16 in a two-dimensional array in the access transistor layer 12 can be connected to a substantially vertical stack of a plurality column segments 39 of MRAM cells 38 arranged substantially over each single access transistor 16 so that the plurality of column segments 39 in this "Y-Z" direction will have their respective sense lines 33 connected together by virtue of a sense line interconnect 32 (explained below). This architecture is represented in a two-dimensions in FIG. 1 and in a three-dimensions in FIG. 2. The "X," "Y," and "Z" axes are shown in each figures.

Referring again to FIGS. 1-2, a portion of an exemplary MRAM device is shown. FIG. 1 is a two dimensional illustration, while FIG. 2 is a three dimensional depiction of a portion of a memory device containing the invention. Certain aspects of the invention may be easier to see in one of FIGS. 1-2. Structures and details unnecessary for an understanding of the invention have been omitted for clarity.

FIG. 1 illustrates an access transistor layer 12 formed over a semiconductor substrate 10. The access transistor layer 12 includes at least a two-dimensional array (in the "X,Y" plane) of access transistors 16. As best shown in FIG. 2, the access transistors 16 are arranged over the substrate 10 along the "X" and "Y" axis directions. It should be recognized that since FIGS. 1-2 only illustrate a portion of an MRAM device, there are other access transistors 16 over the substrate in both the "X" and "Y" axis directions arranged in a similar pattern to that shown in FIGS. 1-2. Additionally, while FIGS. 1-2 illustrate only two MRAM cells 38 per column segment 39, each column segment 39 actually contains many more MRAM cells 38, e.g., thirty-two MRAM cells.

The access transistors 16 can be typical N-channel MOSFET (metal oxide semiconductor field effect transistor), though the specific structure of the access transistors 16 is not crucial to the invention. The transistors 16 include source/drain 14 active areas in the substrate 10. Over the substrate 10, the transistor 16 includes a gate oxide 18, and over this there is typically a polysilicon layer 20 with an overlying silicide layer 22, all topped by a nitride cap 24. The polysilicon layer 20 and silicide layer 22 together form a control line 23 (that continues in the "X" axis direction). The sides of the access transistor 16 control line 23 are insulated and protected by insulating sidewalls 26, typically made of an oxide or nitride material. Access transistors 16 for use in this invention can be fabricated by any techniques well known to those of skill in the art.

The access transistor layer 12 also includes an insulating dielectric layer 28 over and around the access transistors 16. Through this insulating dielectric layer 28 conductive plugs 30 can be fabricated to connect to the source/drain regions 14 of the access transistors 16. The insulating dielectric 28 can be any material known in the art, such as an oxide or BPSG, and can be formed according to methods well known in the art. The conductive plugs 30 similarly can be any material well known in the art, but preferably are polysilicon or tungsten, and can be formed by known methods. These conductive plugs 30 can serve as connections for electrically connecting the underlying access transistors 16 to the overlying column segments 39 of MRAM cells 38 of the MRAM array layers 34, as well as for connection to additional circuitry, such as bit lines 31 leading to lines 31a which are coupled to sense amplifiers 50 used during the reading of the MRAM cells 38. The connections between the access transistors 16 and the MRAM array layers 34 and the bit lines 31 are typically formed as metal interconnects 36, provided within an insulating material. The metal interconnects 36 and bit lines 31 can be copper, aluminum, or any other metal or other conductor known as suitable in the art, and can be formed by known methods.

As noted, the bit lines 31, which are connected via lines 31a to the sense amplifier 50, are coupled to the access transistors 16 by the metal interconnects 36 and conductive plugs 30. As shown in FIGS. 1-2, the stacked MRAM array layers 34 form stacked columns of MRAM cells 38. Each column is divided into a plurality of column segments 39, best seen in FIG. 2.

The cells 38 are also arranged in two-dimensional arrays (in the "X,Y" plane) in each layer 34, where each cell 38 is defined at the intersection of a common read/write line 44 and a sense line 33 of a column segment, which can be, and generally are, orthogonal to each other. Each sense line 33 of a column segment 39 in an array 34 is connected to a plurality of MRAM cells that lie substantially in the "Y" axis direction. The column segment sense lines 33 of the stacked planar layers 34 are vertically interconnected by a metal interconnect 32. Write only column lines 40 (FIG. 1) are provided in each array 34 to assist in writing memory cells 38 of the column.

Figure 3:
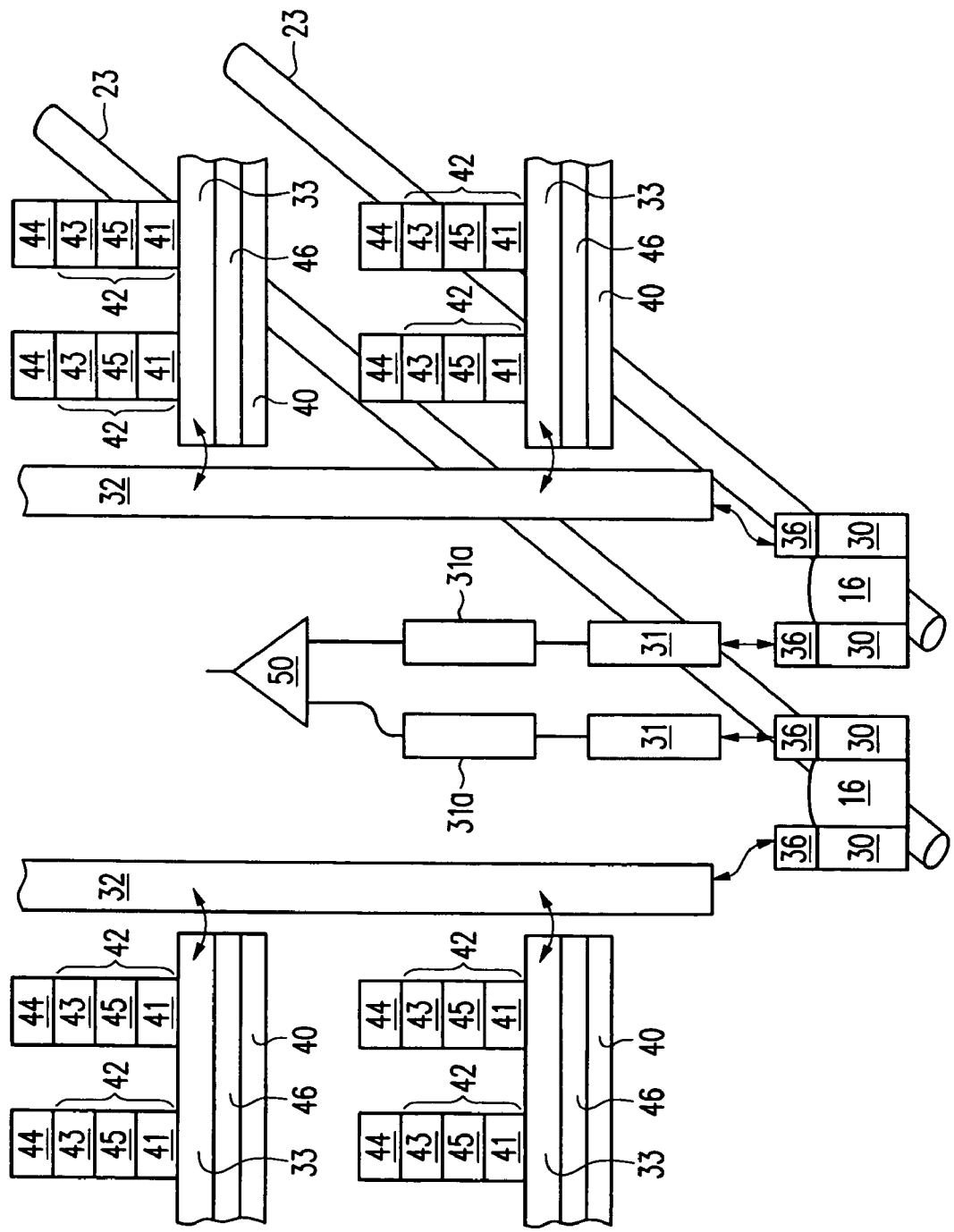
FIG. 3 is a block diagram and representational illustration of an MRAM memory cell showing the interaction between the layers of the cell and peripheral circuitry.

Referring to FIG. 3, each MRAM cell 38 includes, at its most basic configuration, the read/write common line 44 used for both the reading and writing functions, a magnetic bit 42, a sense line 33 used for the reading function, and a write-only line 40 used for the writing function, which is separated from the sense line 33 by an insulating layer 46. The magnetic bit 42 includes a free ferromagnetic layer 43, a tunnel junction layer 45, and a pinned ferromagnetic layer 41. In the preferred embodiment, the free ferromagnetic layer 43 is above the pinned ferromagnetic layer 41, which is adjacent the sense line 33; however, it is possible to reverse the location of the pinned and free layers as is known in the art. In the preferred embodiment, MRAM cells 38 sharing a sense line interconnect 32 are in a column segment 39 above the access transistor 16 to which it is connected.

The write-only line 40 of the MRAM cell 38 can be composed of conductive materials as known in the art; the particular combination of materials making up the write-only line is not a critical element of the invention; however, as an example this line 40 can be copper or aluminum, for instance. The write-only line 40 is insulated from its surroundings by a dielectric layer 46, which also insulates other elements of the MRAM cell 38 and the MRAM array layer 34. Though shown in segments associated with the MRAM cells 38 in FIGS. 1-2, the write-only lines 40 actually are continuous and travel around the sense line interconnects 32 as shown by the arrows A in FIG. 1.

Shown most clearly in FIG. 3, above the write-only line 40 is the sense line 33, which will be further described below, and the magnetic bit 42, which is in contact with the read/write common line 44. The pinned ferromagnetic layer 41 includes an associated antiferromagnetic layer, such as iron manganese, which keeps the magnetic orientation of this layer 41 fixed, i.e., "pinned." The magnetic material of the pinned ferromagnetic layer 41 can be selected from many various materials or alloys with good magnetic properties, such as nickel iron cobalt or nickel iron, for instance. The tunnel junction 45 is a region separating the two ferromagnetic layers 41 and 43. The tunnel junction 45 can be made of many materials, as is known in the art, but the preferred material is aluminum oxide. Over the tunnel junction 45 is the free ferromagnetic layer 43, which can be made of the same materials having magnetic properties as the pinned ferromagnetic layer 41. As opposed to the pinned ferromagnetic layer 41, the free ferromagnetic layer 43 is free to shift it magnetic orientation for the writing of the MRAM cell 38 and has no associated antiferromagnetic layer. The free ferromagnetic layer 43 is in electrical contact with a common read/write line 44.

Referring again to FIGS. 1-2, multiple MRAM array layers 34 are stacked over one another in the "Z" axis direction, thereby increasing the density of the MRAM device. Over the uppermost MRAM array layer 34 a nitride passivation layer 48 will typically protect the MRAM device. Although four MRAM layers 34 are shown in the drawing, there is no restrictive limit to the number of MRAM array layers 34 of the MRAM device of the invention, other than the practicality of physical size of the ultimate device.

Each column segment 39 of MRAM cells 38 of each layer 34 has its own sense line 33, which is connected to each MRAM cell 38 within the same column segment 39. The sense line 33 is also electrically connected to the sense line interconnect 32, which is itself electrically connected to the access transistor 16. The sense line 33 can be made of any conductive material, but is preferably copper or aluminum. The sense line 33 runs above the write-only line 40, separated therefrom by the dielectric 46, and below and in contact with the magnetic bit 42. In this architecture a single access transistor 16 would be shared by each column segment 39 of the MRAM cells 38 in the "Y-Z" planar direction substantially above the access transistor 16, as shown in FIGS. 2-3. Thus, each access transistor 16 serves the same column segment 39 in each of the MRAM layers 34 located over the access transistor 16.

During the write operation an MRAM cell 38 is addressed by the coinciding activation of the read/write common line 44 and a write-only line 40 associated with that cell 38 by peripheral decoding circuitry, and the actual writing of memory is performed as is known in the art as a function of the magnetic field orientations caused by the current through the common read/write line 44 and write only line 40. To read stored information in an MRAM cell 38, the cell 38 is addressed by activating a read/write line 44 in a row of a layer 34 containing the cell and an associated access transistor 16 via control line 23 (FIG. 3). This couples the accessed cell 38 to a sense amplifier 50 which senses all resistance and provides a logical signal representing the logic state stored in the accessed cell. Thus, cell 38 in the three-dimensional array (as shown in FIGS. 2-3) is addressed for reading in the "X" axis direction by an access transistor 16 coupled to the stacked sense lines 33 of the column segment 39 containing the cell and in the "Y-Z" planar direction and by the read/write common row line 44 of one of the planar layers 34.

One major difference between the above described MRAM array and a standard memory array is the use of multiple MRAM array layers 34. Conventional row and column addressing techniques can be used to select MRAM cells 38 in each array layer 34. Additional address bits are used to select one of the array layers 34. For the four array layers 34 shown in FIGS. 1-2, this would require two additional address bits which can be added to the row or column address bits. Once the row or column addresses has been received in the MRAM device, they are decoded to activate an addressed row of an addressed layer, and a column segment (access transistor 16). For example, if the MRAM device is a 16 Mbit array organized as 2048 rows by 2048 columns by 4 layers, the memory device would utilize an 11-bit ($2^{11}$=2048) row address and a 13-bit column address, with 11 of the 13 bits used for a column segment selection ($2^{11}$=2048) and the two remaining column bits used for layer array 34 selection ($2^2$=4). Thus, the 11-bit row address is decoded by a row decoder 81 (FIG. 3), while the 11-bits of the column address is decoded by a column decoder 82 (which includes a column segment decoder 83) and the 2-bit layer address is decoded by a plane decoder 84.

As illustrated in FIG. 3, the row decoder 81 accepts a row address and produces a decoded signal R, which is supplied as an input to the layer decoder 84. The layer decoder 84 also accepts (at least a portion of) the column address and produces a decoded signal RL for selecting a row and a layer. The column address is also provided to the column decoder 82, which includes a column segment decoder 83. The column decoder 82 may operate on a set of bits of the column address (e.g., lower address bits of the column address) while the column segment decoder 83 may operate on the remaining bits of the column address (e.g., higher address bits of the column address). The column decoder 82 outputs a signal C used to select a column, while the column segment decoder 83 output a signal CS which is supplied on control lines 23 to activate one of the access transistors 16. In order to avoid cluttering the diagram the signals RL and C are only illustrated in general form with respect to the top layer in FIG. 3, but it should be understood that signals RL and C are supplied to each array layer 34 in a manner to permit a particular MRAM cell in the array to be addressed.

Once an MRAM cell in the array has been addressed as described above, the addressed cell is coupled to one of the inputs of a sense amplifier 50 via the sense lines 33, the sense line interconnect 32, the access transistor 16, bit line 31, and one of the lines 31a. The other input of the sense amplifier 50 is coupled to another one of the lines 31a as a reference or a separate reference voltage can be used. The sense amplifier 50 senses the resistance of the selected cell 38 connected to one input of the sense amp 50 using the other input of the sense amp 50 as a reference, using any of the methods well known in the art.

The architecture of this invention provides for a transistor driver (the access transistor 16) for a reading operation which is located much closer to both a selected MRAM cell 38 and between the selected cell 38 and the sense amplifier 50 enabling a faster and more reliable read function. This produces a higher signal-to-noise ratio during the read function than would a conventional cross-point architecture. In this arrangement, the MRAM three-dimensional array essentially consists of an 1T-nMTJ architecture, where n is equal to the number of MRAM cells 38 per column segment 39. Accordingly, fewer access transistors 16 are required than is needed in the 1T-1MTJ architecture known in the art.

Figure 4:
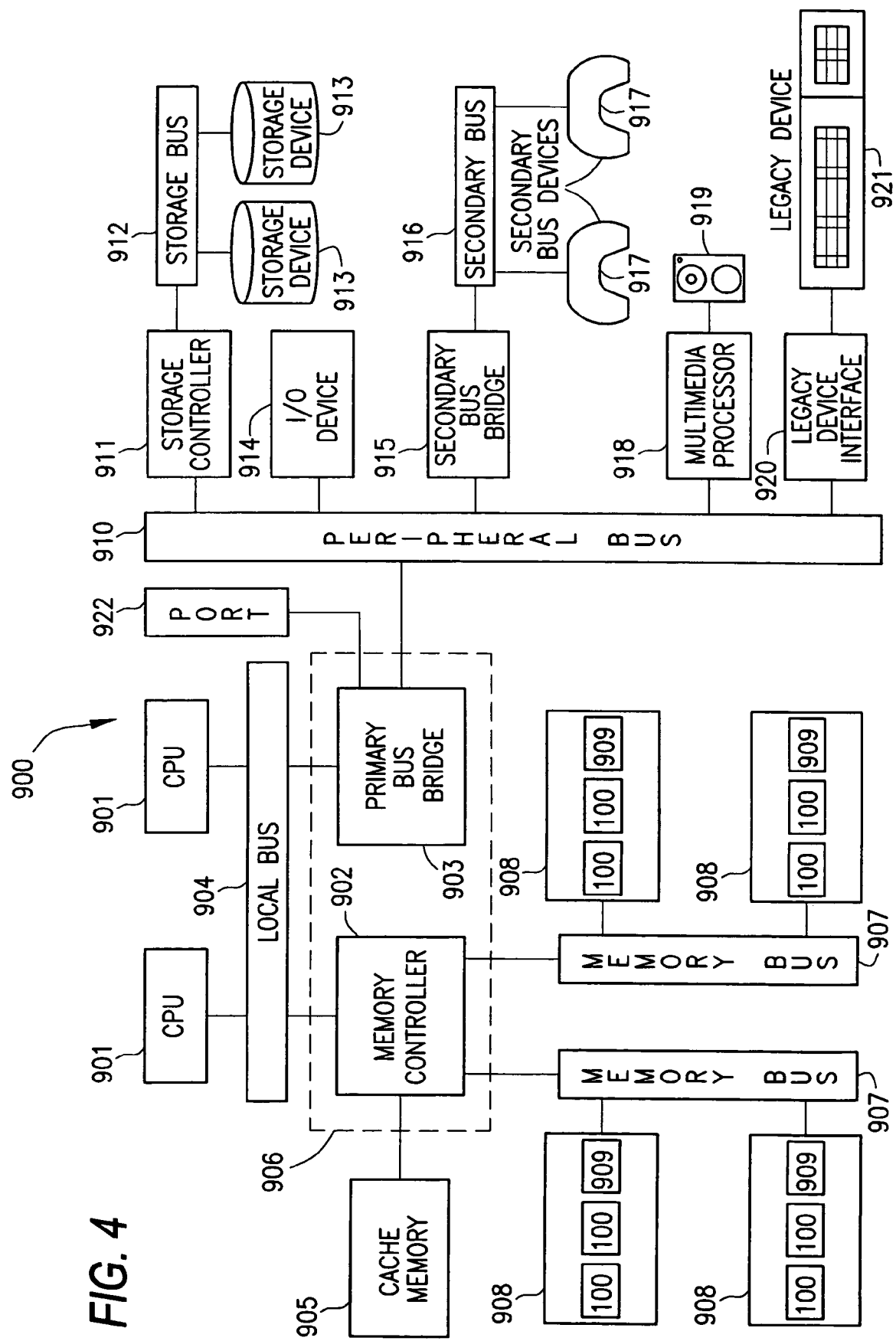
FIG. 4 is a block diagram representation of a processor-based system incorporating an MRAM device in accordance with the invention.

FIG. 4 illustrates an exemplary processing system 900 which may utilize the memory device 100 of the present invention. The processing system 900 includes one or more processors 901 coupled to a local bus 904. A memory controller 902 and a primary bus bridge 903 are also coupled to the local bus 904. The processing system 900 may include multiple memory controllers 902 and/or multiple primary bus bridges 903. The memory controller 902 and the primary bus bridge 903 may be integrated as a single device 906.

The memory controller 902 is also coupled to one or more memory buses 907. Each memory bus accepts memory components 908 which include at least one MRAM memory device 100 constructed as described above with reference to FIGS. 1-3. The memory components 908 may be a memory card or a memory module. Examples of memory modules include single inline memory modules (SIMMs) and dual inline memory modules (DIMMs). The memory components 908 may include one or more additional devices 909. For example, in a SIMM or DIMM, the additional device 909 might be a configuration memory, such as a serial presence detect (SPD) memory. The memory controller 902 may also be coupled to a cache memory 905. The cache memory 905 may be the only cache memory in the processing system. Alternatively, other devices, for example, processors 901 may also include cache memories, which may form a cache hierarchy with cache memory 905. If the processing system 900 include peripherals or controllers which are bus masters or which support direct memory access (DMA), the memory controller 902 may implement a cache coherency protocol. If the memory controller 902 is coupled to a plurality of memory buses 907, each memory bus 907 may be operated in parallel, or different address ranges may be mapped to different memory buses 907.

The primary bus bridge 903 is coupled to at least one peripheral bus 910. Various devices, such as peripherals or additional bus bridges may be coupled to the peripheral bus 910. These devices may include a storage controller 911, an miscellaneous I/O device 914, a secondary bus bridge 915, a multimedia processor 918, and an legacy device interface 920. The primary bus bridge 903 may also coupled to one or more special purpose high speed ports 922. In a personal computer, for example, the special purpose port might be the Accelerated Graphics Port (AGP), used to couple a high performance video card to the processing system 900.

The storage controller 911 couples one or more storage devices 913, via a storage bus 912, to the peripheral bus 910. For example, the storage controller 911 may be a SCSI controller and storage devices 913 may be SCSI discs. The I/O device 914 may be any sort of peripheral. For example, the I/O device 914 may be an local area network interface, such as an Ethernet card. The secondary bus bridge may be used to interface additional devices via another bus to the processing system. For example, the secondary bus bridge may be an universal serial port (USB) controller used to couple USB devices 917 via to the processing system 900. The multimedia processor 918 may be a sound card, a video capture card, or any other type of media interface, which may also be coupled to one additional devices such as speakers 919. The legacy device interface 920 is used to couple legacy devices, for example, older styled keyboards and mice, to the processing system 900.

The processing system 900 illustrated in FIG. 4 is only an exemplary processing system with which the invention may be used. While FIG. 4 illustrates a processing architecture especially suitable for a general purpose computer, such as a personal computer or a workstation, it should be recognized that well known modifications can be made to configure the processing system 900 to become more suitable for use in a variety of applications. For example, many electronic devices which require processing may be implemented using a simpler architecture which relies on a CPU 901 coupled to memory components 908 and/or memory devices 100. These electronic devices may include, but are not limited to audio/video processors and recorders, gaming consoles, digital television sets, wired or wireless telephones, navigation devices (including system based on the global positioning system (GPS) and/or inertial navigation), and digital cameras and/or recorders. The modifications may include, for example, elimination of unnecessary components, addition of specialized devices or circuits, and/or integration of a plurality of devices.

The above description and accompanying drawings are only illustrative of exemplary embodiments, which can achieve the features and advantages of the present invention. It is not intended that the invention be limited to the embodiments shown and described in detail herein. The invention can be modified to incorporate any number of variations, alterations, substitutions or equivalent arrangements not heretofore described, but which are commensurate with the spirit and scope of the invention. For example, while the invention has been described within the context of memory devices employing MRAM memory cells, other types of memory cells such as programmable conductor random access memory (PCRAM) cells may also be used with the present invention. The invention is only limited by the scope of the following claims.

What is claimed as new and desired to be protected by Letters Patent of the United States is:

1. A method of fabricating a memory device, comprising:
   providing a substrate;
   forming an access transistor on said substrate, said access transistor having a first active area and a second active area;
   providing a bit line in electrical contact with said first active area;
   providing an interconnect in electrical contact with said second active area;
   forming a first write only line;
   forming a first sense line associated with a first plurality of memory bits, said first sense line being formed over said access transistor and in electrical contact with said interconnect, wherein said interconnect is in electrical contact with said first plurality of memory bits via said first sense line;
   forming said first plurality of memory bits, each of said first plurality of memory bits being formed over, and in electrical contact with, said first sense line;
   forming a second sense line, said second sense line being formed over said first plurality of memory bits and in electrical contact with said interconnect;
   forming a second plurality of memory bits, each of said second plurality of memory bits being formed over, and in electrical contact with, said second sense line.

2. The method of claim 1, wherein the act of forming said first plurality of memory bits comprises:
   forming a plurality of first memory storage regions over said first sense line; and
   forming a first plurality of common lines;
   wherein each of said first plurality of common lines is formed over one of said plurality of first memory storage regions.

3. The method of claim 2, wherein said step of forming said first sense line comprises:
   forming a first write only line;
   forming a first dielectric line over said first write only line; and
   forming said first sense line over said first write only line.

4. The method of claim 3, wherein
   said step of forming said first sense line comprises:
   forming a first write only line;
   forming a first dielectric line over said first write only line; and
   forming said first sense line over said first write only line; and
   said step of forming said second sense line comprises:
      forming a second write only line;
      forming a second dielectric line over said second write only line; and
      forming said second sense line over said second write only line; and
   said step of forming said second plurality of memory bits comprises:
      forming a plurality of second memory storage regions over said second sense line; and
      forming a second plurality of common lines, wherein each of said second plurality of common lines being formed over one of said plurality of second memory storage regions.

5. The method of claim 2, wherein said step of forming said second plurality of memory bits comprises:
   forming a plurality of second memory storage regions over said first sense line; and
   forming a second plurality of common lines;

wherein each of said second plurality of common lines is formed over one of said plurality of second memory storage regions.

6. The method of claim 2, wherein each of said first plurality of common lines is formed orthogonal to said first sense line.

7. The method of claim 6, wherein
said step of forming said second plurality of memory bits comprises:
forming a plurality of second memory storage regions over said first sense line; and
forming a second plurality of common lines, each of said second plurality of common lines being formed over one of said plurality of second memory storage regions, and each of said second plurality of common lines being orthogonal to said second sense line.

8. The method of claim 1, further comprising:
providing a sense amplifier in electrical contact with said bit line.

9. The method of claim 1, wherein said step of forming said access transistor comprises:
forming a source region;
forming a drain region;
forming a gate structure between said source region and said drain region;
providing a plurality of conductive plugs to said source region and said drain region, said bit line being in electrical contact with one of said conductive plugs and said interconnect being in electrical contact with another of said conductive plugs.

10. The method of claim 1, wherein each of said first plurality of memory bits and each of said second plurality of memory bits is a magnetic memory element.

11. The method of claim 1, wherein each of said first plurality of memory bits and each of said second plurality of memory bits is a programmable conductor variable resistance memory element.

12. The method of claim 1, wherein each of said first plurality of memory bits and each of said second plurality of memory bits is a phase-changing chalcogenide memory element.

13. A method for forming a memory device, comprising:
providing a sense amplifier;
providing an interconnect;
providing an access transistor, said access transistor being capable of electrically connecting said sense amplifier with said interconnect;
providing a plurality of array planes over said access transistor, each of said array planes comprising a plurality of memory cells organized into a plurality of rows and a plurality of columns;
providing a plurality of common lines, each of said common lines being associated with and coupled to a respective column of said plurality of memory cells; and
forming a first write only line; providing a plurality of sense lines, each of said sense lines being associated with and coupled to a respective row of said plurality of memory cells
wherein each of said common lines is coupled to one of said plurality of sense lines on each of said plurality of array planes via one of said plurality of memory cells.

14. The method of claim 13, wherein each of said plurality of memory cells and each of said second plurality of memory bits is a MRAM memory element.

15. The method of claim 13, wherein each of said plurality of memory cells and each of said second plurality of memory bits is a programmable conductor variable resistance memory element.

16. The method of claim 13, wherein each of said plurality of memory cells and each of said second plurality of memory bits is a phase-changing chalcogenide memory element.

* * * * *